US 9,875,963 B2

(12) United States Patent
Kushibe et al.

(10) Patent No.: US 9,875,963 B2
(45) Date of Patent: Jan. 23, 2018

(54) SEMICONDUCTOR DEVICE (71) Applicant: Toshiba Memory Corporation, Minato-ku (JP)

(72) Inventors: Hidefumi Kushibe, Kamakura (JP); Hiroyuki Ideno, Yokohama (JP); Masayuki Usuda, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/848,810

(22) Filed: Sep. 9, 2015

(65) Prior Publication Data

US 2016/0181199 A1 Jun. 23, 2016

Related U.S. Application Data

(60) Provisional application No. 62/094,523, filed on Dec. 19, 2014.

(51) Int. Cl.
*G05F 1/10* (2006.01)
*G05F 3/02* (2006.01)
*H01L 23/522* (2006.01)

(52) U.S. Cl.
CPC .......... *H01L 23/5228* (2013.01); *G05F 3/02* (2013.01); *H01L 23/5223* (2013.01); *H01L 2924/0002* (2013.01)

(58) Field of Classification Search
CPC . G05F 3/262; G05F 3/265; G05F 3/30; G05F 3/205; G11C 5/147

USPC ................. 327/530, 538, 540, 541
See application file for complete search history.

(56) References Cited

U.S. PATENT DOCUMENTS

| | | | | |
|---|---|---|---|---|
| 5,635,822 | A * | 6/1997 | Marchio et al. | 323/273 |
| 6,472,929 | B2 * | 10/2002 | Kobayashi | G05F 3/242 |
| | | | | 327/540 |
| 6,677,809 | B2 * | 1/2004 | Perque et al. | 327/541 |
| 7,321,257 | B2 | 1/2008 | Yamamoto et al. | |
| 8,076,911 | B2 | 12/2011 | Ariki | |
| 8,134,228 | B2 * | 3/2012 | Komatsu et al. | 257/686 |
| 8,537,099 | B2 * | 9/2013 | Aioanei | G09G 3/3696 |
| | | | | 345/102 |
| 2002/0163018 | A1* | 11/2002 | Kamiya | 257/208 |
| 2012/0194149 | A1* | 8/2012 | Noda | 323/274 |
| 2014/0210544 | A1* | 7/2014 | Kameyama et al. | 327/538 |

FOREIGN PATENT DOCUMENTS

| | | |
|---|---|---|
| JP | 05-226567 | 9/1993 |
| JP | 3759135 | 3/2006 |
| JP | 2009-003886 | 1/2009 |
| JP | 2011-238687 | 11/2011 |

* cited by examiner

*Primary Examiner* — Quan Tra
(74) *Attorney, Agent, or Firm* — Oblon, McClelland, Maier & Neustadt, L.L.P.

(57) ABSTRACT

According to one embodiment, an integrated circuit is formed on a semiconductor chip, a regulator supplies power to the integrated circuit via the power-supply wire, a first resistor is connected between the first pad electrode and the power-supply wire on the semiconductor chip, and a second resistor is connected between the second pad electrode and the power-supply wire on the semiconductor chip and has a resistance smaller than that of the first resistor.

18 Claims, 6 Drawing Sheets

SEMICONDUCTOR DEVICE

CROSS-REFERENCE TO RELATED APPLICATIONS

This application is based upon and claims the benefit of priority from U.S. Provisional Application No. 62/94523, filed on Dec. 19, 2014; the entire contents of which are incorporated herein by reference.

FIELD

Embodiments described herein relate generally to a semiconductor device.

BACKGROUND

For a regulator configured to supply power to an integrated circuit, an external capacitor may be attached to a semiconductor chip with the integrated circuit to prevent oscillations of regulator output.

At that time, antiresonance may occur between the parasitic inductance of a wire for the external capacitor and the parasitic capacitance of the integrated circuit, which results in unstable operations of the regulator.

DETAILED DESCRIPTION

In general, according to one embodiment, a semiconductor device includes an integrated circuit, a regulator, a first resistor, and a second resistor. The integrated circuit is formed on a semiconductor chip. The regulator supplies power to the integrated circuit via a power-supply wire. The first resistor is connected between a first pad electrode of the semiconductor chip and the power-supply wire. The second resistor is connected between a second pad electrode of the semiconductor chip and the power-supply wire, which is smaller in resistance than the first resistor.

Exemplary embodiments of a semiconductor device will be explained below in detail with reference to the accompanying drawings. The present invention is not limited to the following embodiments.

(First Embodiment)

Figure 1:
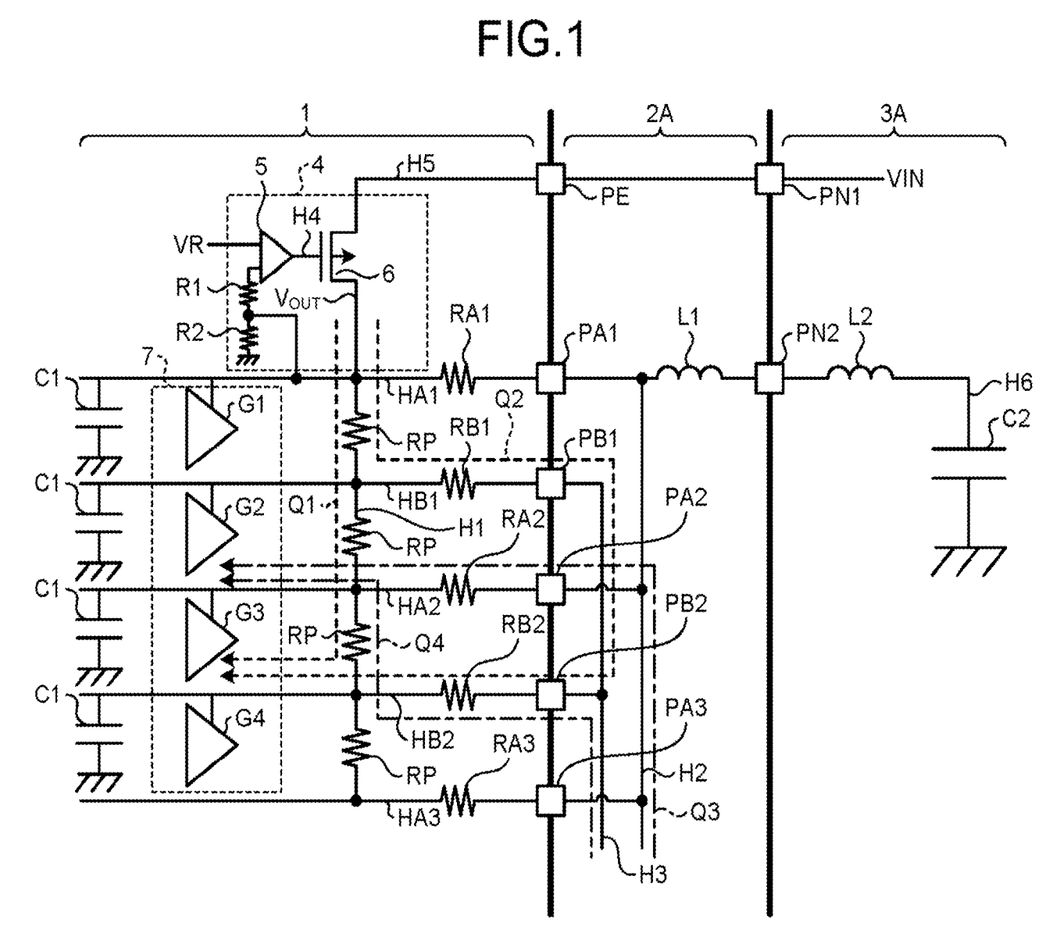
FIG. 1 is a schematic circuit diagram of a semiconductor device according to a first embodiment.

FIG. 1 is a schematic circuit diagram of a semiconductor device according to a first embodiment. Referring to FIG. 1, a semiconductor chip 1 is sealed in a package 2A. The package 2A is mounted on a wiring substrate 3A. The package 2A may be a QFP (Quard Flat Package), a BGA (Ball Grid Array), a TCP (Tape Carrier Package), or a CSP (Chip Size Package), for example.

The semiconductor chip 1 includes a regulator 4 and an integrated circuit 7. The regulator 4 may be a series regulator. The semiconductor chip 1 also has pad electrodes PE, PA1 to PA3, PB1, and PB2 disposed thereon. The pad electrode PE can be used to supply a regulator power VIN from the outside of the semiconductor chip 1. The pad electrodes PA1 to PA3, PB1, and PB2 can be used to take out a regulator output VOUT to the outside of the semiconductor chip 1. The pad electrodes PA1 to PA3 are preferably arranged at regular spacings around the semiconductor chip 1. The regulator 4 can supply the regulator output VOUT as power to the integrated circuit 7 via a power-supply wire H1. The power-supply wire H1 has a parasitic resistor RP. The parasitic resistor RP is dispersed in the power-supply wire H1. In this example, the integrated circuit 7 includes internal circuits G1 to G4 that are individually supplied with power via the power-supply wire H1. The internal circuits G1 to G4 may be logic circuits, memory elements, or sensor elements, for example. The internal circuits G1 to G4 have a parasitic capacitance C1. The parasitic capacitance C1 is dispersed in the internal circuits G1 to G4. The power-supply wire H1 here refers to a wire that constitutes current pathways to the internal circuits G1 to G4 from the regulator output VOUT when the semiconductor chip 1 is singly provided. For example, the portions of the parasitic resistor RP illustrated in FIG. 1 can constitute the current pathways to the internal circuits G1 to G4 from the regulator output VOUT and thus are included in the power-supply wire H1.

The H1 is connected to the pad electrodes PA1 to PA3 via the resistors RA1 to RA3, and is connected to the pad electrodes PB1 and PB2 via the resistors RB1 and RB2. Wires HA1 to HA3 routed from the power-supply wire H1 toward the pad electrodes PA1 to PA3 can be used to connect the resistors RA1 to RA3 between the power-supply wire H1 and the pad electrodes PA1 to PA3, respectively. Wires HB1 and HB2 routed from the power-supply wire H1 toward the pad electrodes PB1 and PB2 can be used to connect the resistors RB1 and RB2 between the pad electrodes PB1 and PB2 and the power-supply wire H1, respectively. The resistors RB1 and RB2 are preferably connected to the power-supply wire H1 at different positions. For example, the resistor RB1 may be connected to the power-supply wire H1 at the position closest to the regulator 4, and the resistor RB2 may be connected to the power-supply wire H1 at the position farthest from the regulator 4. Alternatively, the resistor RB1 may be connected to the power-supply wire H1 at the position with the smallest parasitic resistor RP as seen from the regulator 4, and the resistor RB2 may be connected to the power-supply wire H1 at the position with the largest parasitic resistor RP as seen from the regulator 4. In addition, the resistances of the resistors RA1 to RA3, RB1, and RB2 are set such that the resistances between the pad electrodes PB1 and PB2 and the power-supply wire H1 are lower than the resistances between the pad electrodes PA1 to PA3 and the power-supply wire H1. For example, the resistance between the pad electrode PA1 and the power-supply wire H1 is obtained by adding up the resistance of the wire HA1 and the resistance of the resistor RA1. Similarly, the resistance between the pad electrode PB1 and the power-supply wire H1 is obtained by adding up the resistance of the wire HB1 and the resistor RB1. When wiring resistances of the wires HA1 to HA3, HB1, and HB2 are negligible, the resistances of the resistors RB1 and RB2 are set to be lower than the resistances of the resistors RA1 to RA3. The power-supply wire H1 is connected to the pad electrodes PA1 to PA3 via the wires HA1 to HA3, and is connected to the pad electrodes PB1 and PB2 via the wires HB1 and HB2. As the resistors RA1 to RA3, parasitic resistances of the wires HA1 to HA3 may be used. In this case, the resistance between the pad electrode PA1 and the power-supply wire H1 constitutes the parasitic resistance of the wire HA1. As the resistors RB1 and RB2, parasitic resistances of the wires HB1 and HB2 may be used. In this case, the resistance between the pad electrode PB1 and the power-supply wire H1 constitutes the parasitic resistance of the wire HB1. The wiring resistances of the wires HB1 and HB2 can be lower than the wiring resistances of the wires HA1 to HA3. To set the wiring resistances of the wires HB1 and HB2 to be lower than the wiring resistances of the wires HA1 to HA3, the widths of the wires HB1 and HB2 may be made larger than the widths of the wires HA1 to HA3, or the lengths of the wires HB1 and HB2 may be made smaller than the lengths of the wires HA1 to HA3. The wires HB1 and HB2 may be composed of multi-layer wires. In this case, the wire resistors of the wires HB1 and HB2 may include the wire resistor of a plane wire and the resistor of a contact plug connecting the upper-layer wire and the lower-layer wire. The wires HA1 to HA3, HB1, and HB2 routed from the power-supply wire H1 toward the pad electrodes PA1 to PA3, PB1, and PB2 do not constitute the current pathways to the internal circuits G1 to G4 from the regulator output VOUT when the semiconductor chip 1 is singly provided, and thus the wires HA1 to HA3, HB1, and HB2 are not included in the power-supply wire H1.

The regulator 4 includes an amplifier 5, a transistor 6, and resistors R1 and R2. The resistors R1 and R2 divide the voltage of the regulator output VOUT and supply the same to the amplifier 5. The source of the transistor 6 is connected to the pad electrode PE via a power-supply wire H5. The drain of the transistor 6 is connected to the power-supply wire H1. The gate of the transistor 6 is connected to the output of the amplifier 5 via a wire H4. The transistor 6 may be a P-channel field-effect transistor. The amplifier 5 compares the divided voltage of the regulator output VOUT to a reference voltage VR.

The package 2A includes wires H2, H3 and pins PN1, PN2. The pin PN1 can be used to supply the regulator power VIN from the outside of the package 2A. The pin PN2 can be used to take out the regulator output VOUT to the outside of the package 2A. The wire H2 is connected to the pad electrodes PA1 to PA3, and the wire H3 is connected to the pad electrodes PB1 and PB2. The pin PN1 is connected to the pad electrode PE, and the pin PN2 is connected to the wire H2. The wire H2 is provided with a parasitic inductance L1. The parasitic inductance L1 is dispersed to the wire H2.

The wiring substrate 3A includes a wire H6 and a capacitor C2. The capacitor C2 is connected to the pin PN2 via the wire H6. The wire H6 is provided with a parasitic inductance L2. The parasitic inductance L2 is dispersed in the wire H6.

The regulator power VIN is supplied to the source of the transistor 6 via the pin PN1 and the pad electrode PE in sequence. Then, the regulator output VOUT is output from the drain of the transistor 6 and is supplied to the internal circuits G1 to G4 via the power-supply wire H1. In addition, the regulator output VOUT is divided in voltage at the resistors R1 and R2, and is supplied to the amplifier 5. Then, the output of the amplifier 5 is set in such a manner that the divided voltage of the regulator output VOUT agrees with the reference voltage VR. Accordingly, the regulator output VOUT can be obtained in proportion to the reference voltage VR. The constant of proportion at that time can be adjusted by the ratio between the voltages divided by the resistors R1 and R2.

At that time, the capacitor C2 is connected to the power-supply wire H1 via the wires H6 and H2 in sequence to prevent oscillations of the regulator 4. In this example, when antiresonance occurs between the parasitic inductances L1 and L2 and the parasitic capacitance C1, regulator operations become unstable. At that time, the resistors RA1 to RA3 serve as damping resistors to suppress antiresonance and stabilize regulator operations. In addition, by connecting the power-supply wire H1 to the pad electrodes PB1 and PB2 via the resistors RB1 and RB2, respectively, it is possible to suppress a voltage drop in the regulator output VOUT caused by the resistors RA1 to RA3, and prevent narrowing of operation margins in the internal circuits G1 to G4.

For example, during operation of the internal circuit G4, when the power-supply wire H1 is not connected to the pad electrodes PB1 and PB2 via the resistors RB1 and RB2, respectively, the pathway for the regulator output VOUT to be supplied to the internal circuit G4 becomes Q1. In the path Q1, a voltage drop is caused in the parasitic resistor RP by the resistors RA1 to RA3, which narrows the operation margin of the internal circuit G4. On the other hand, when the power-supply wire H1 is connected to the pad electrodes PB1 and PB2 via the resistors RB1 and RB2, respectively, the regulator output VOUT can be supplied to the internal circuit G4 through the pathway Q2. The pathway Q2 extends from RB1 through PB1, H3, and PB2 to RB2, bypassing the resistor RA2 and the parasitic resistor RP. As a result, it is possible to reduce a voltage drop in the parasitic resistor RP and suppress narrowing of the operation margin of the internal circuit G4.

In addition, during testing of the internal circuit G3, for example, when the power-supply wire H1 is not connected to the pad electrodes PB1 and PB2 via the resistors RB1 and RB2, respectively, the pathway for power supply to the internal circuit G3 becomes Q3. In the path Q3, a drop voltage is caused by the resistor RA2, which decreases the accuracy of a power-supply voltage in the internal circuit G3. On the other hand, when the power-supply wire H1 is connected to the pad electrodes PB1 and PB2 via the resistors RB1 and RB2, respectively, the pathway for power supply to the internal circuit G3 becomes Q4. The pathway Q4 extends from PB2 to RB2, bypassing the resistor RA2. As a result, it is possible to prevent a drop voltage caused by the resistor RA2 and improve the accuracy of a power-supply voltage in the internal circuit G3. In the configuration example of FIG. 1, by bringing a tester needle into contact with the pad electrode PB2, for example, power can be supplied to the internal circuit G3 at the testing of the internal circuit G3.

In addition, in the configuration example of FIG. 1, the semiconductor chip 1 is provided with the plurality of pad electrodes PA1 to PA3, and the pad electrodes PA1 to PA3 are connected together via the wire H2. Accordingly, even when the arrangement position of the capacitor C2 is set arbitrarily, it is possible to suppress variations in the parasitic inductances L1 and L2 and reduce restrictions in layout design while maintaining stable regulator operations.

In the embodiment described above, a first pad electrode provided in plural is the pad electrodes PA1 to PA3, and a second pad electrode provided in plural is the pad electrodes PB1 and PB2. Alternatively, the first pad electrode may be a single pad electrode, and the second pad electrode may be a single pad electrode.

(Second Embodiment)

Figure 2:
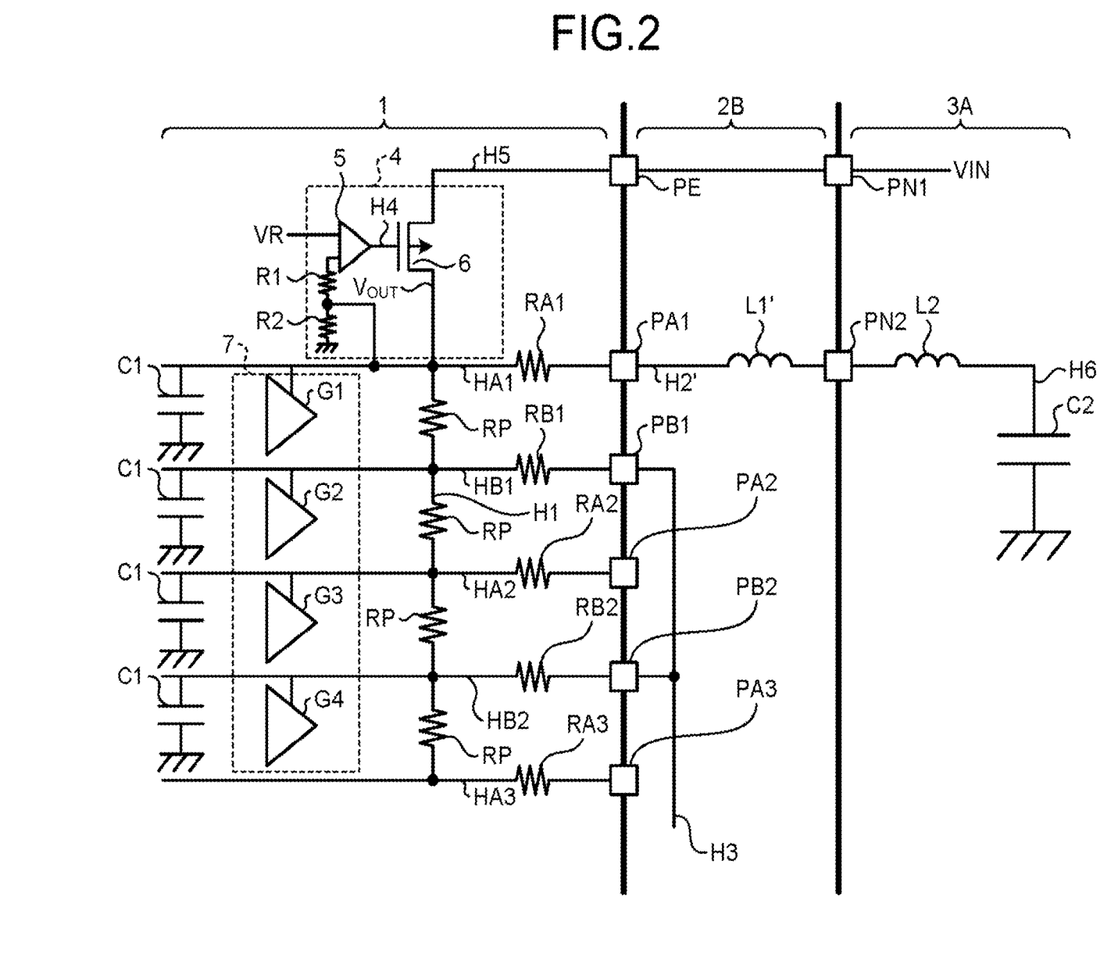
FIG. 2 is a schematic circuit diagram of a semiconductor device according to a second embodiment.

FIG. 2 is a schematic circuit diagram of a semiconductor device according to a second embodiment.

In the configuration of FIG. 2, a package 2B is provided in place of the package 2A illustrated in FIG. 1. The package 2B includes a wire H2' in place of the wire H2. The wire H2' has a parasitic inductance L1'. The parasitic inductance L1' is dispersed in the wire H2'. The wire H2' is connected to the pad electrode PA1. In this configuration, the pad electrodes PA2 and PA3 may be removed from the semiconductor chip 1, thereby reducing the chip size of the semiconductor chip 1.

(Third Embodiment)

Figure 3:
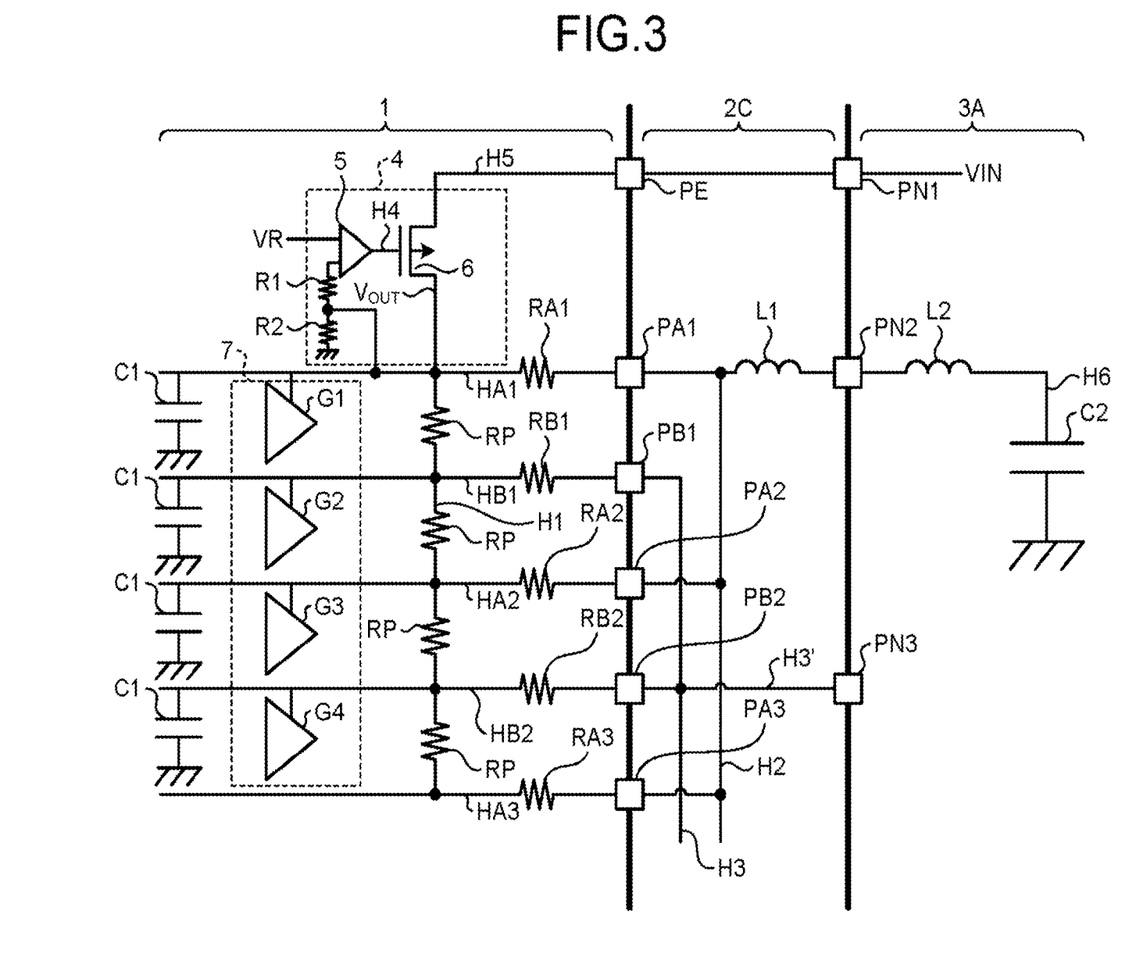
FIG. 3 is a schematic circuit diagram of a semiconductor device according to a third embodiment.

FIG. 3 is a schematic circuit diagram of a semiconductor device according to a third embodiment.

In the configuration of FIG. 3, a package 2C is provided in place of the package 2A illustrated in FIG. 1. The package 2C includes a wire H3' in place of the wire H3, and also has an additional pin PN3. The wire H3' is connected to the pad electrodes PB1, PB2, and the pin PN3. In this configuration, at testing of the internal circuits G1 to G4, power can be supplied from the pin PN3 to the internal circuits G1 to G4. At that time, power can be supplied to the internal circuits G1 to G4 via the resistors RB1 and RB2, bypassing the resistors RA1 to RA3.

As a result, it is possible to prevent a voltage drop caused by the resistors RA1 to RA3, and improve the accuracy of power-supply voltages in the internal circuits G1 to G4.

(Fourth Embodiment)

Figure 4:
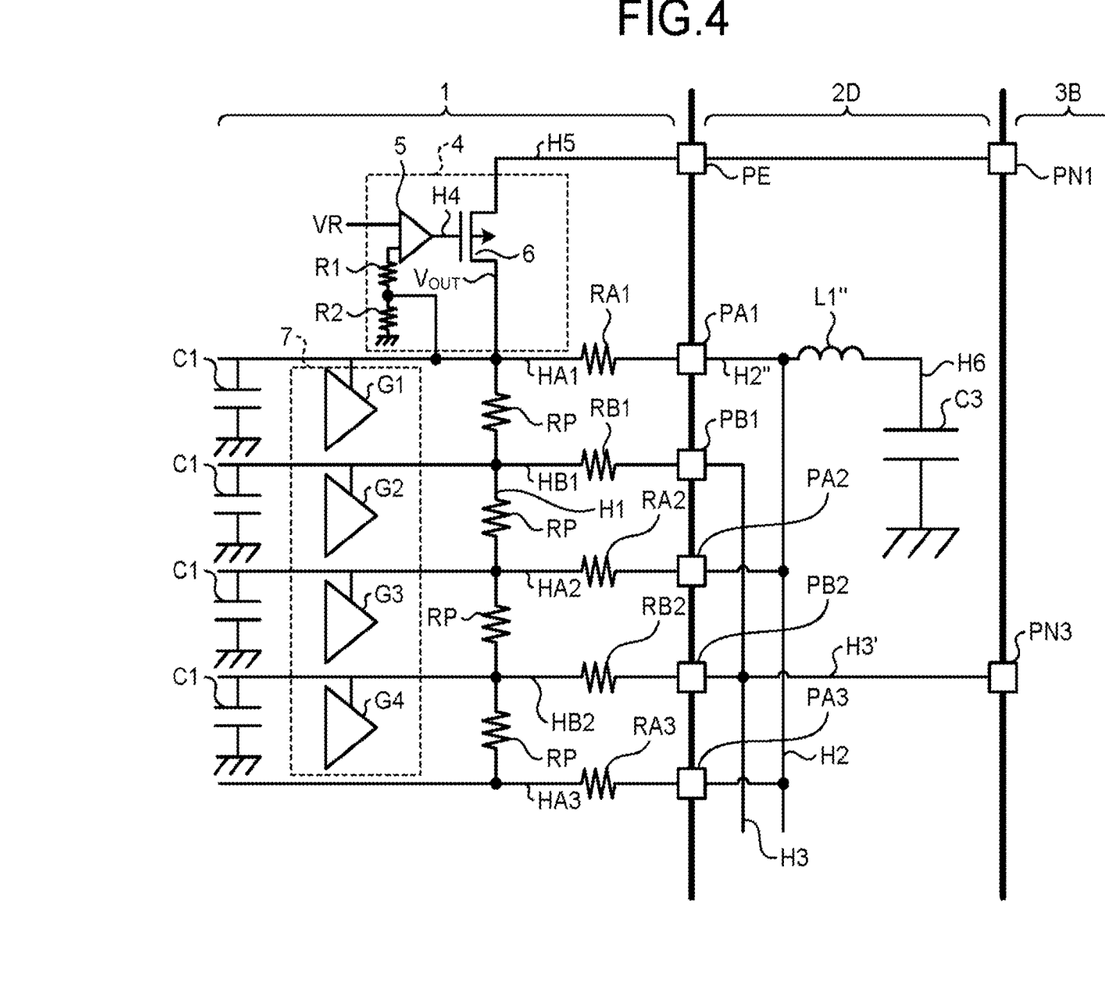
FIG. 4 is a schematic circuit diagram of a semiconductor device according to a fourth embodiment.

FIG. 4 is a schematic circuit diagram of a semiconductor device according to a fourth embodiment.

In the configuration of FIG. 4, a package 2D and a wiring substrate 3B are provided in place of the package 2C and the wiring substrate 3A illustrated in FIG. 3. The package 2D includes a wire H2" in place of the wire H2. The wire H2" has a parasitic inductance L1". The parasitic inductance L1" is dispersed in the wire H2". In addition, a capacitor C3 is added to the package 2D, and the pin PN2 is removed from the package 2D. The wire H2" is connected to the pad electrodes PA1 to PA3 and the capacitor C3. The wire H6 and the capacitor C2 in the wiring substrate 3A are removed from the wiring substrate 3B. In this configuration, the capacitor C3 is connected to the power-supply wire H1 via the wire H2" to prevent oscillations of the regulator 4. In addition, there is no need to provide the package 2D with the pin PN2, which reduces the chip size of the package 2D.

(Fifth Embodiment)

Figure 5:
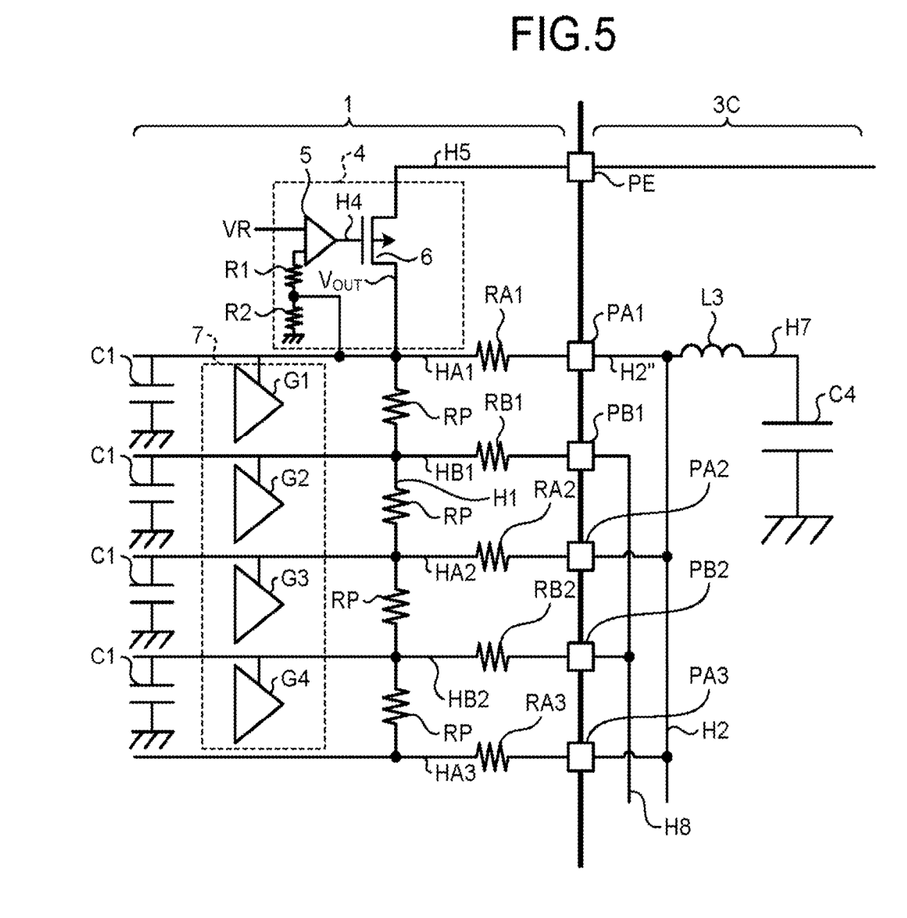
FIG. 5 is a schematic circuit diagram of a semiconductor device according to a fifth embodiment.

FIG. 5 is a schematic circuit diagram of a semiconductor device according to a fifth embodiment.

Referring to FIG. 5, the semiconductor chip 1 is COB-implemented on a wiring substrate 3C. The wiring substrate 3C is provided with wires H7, H8, and a capacitor C4. The wire H7 is connected to the pad electrodes PA1 to PA3 and the capacitor C4, and the wire H8 is connected to the pad electrodes PB1 and PB2. The wire H7 has a parasitic inductance L3. The parasitic inductance L3 is dispersed in the wire H2. In this configuration, the capacitor C4 is connected to the power-supply wire H1 via the wire H7 to prevent oscillations of the regulator 4. In addition, there is no need for a package of the semiconductor chip 1, which decreases the mounting area of the wiring substrate 3C.

(Sixth Embodiment)

Figure 6:
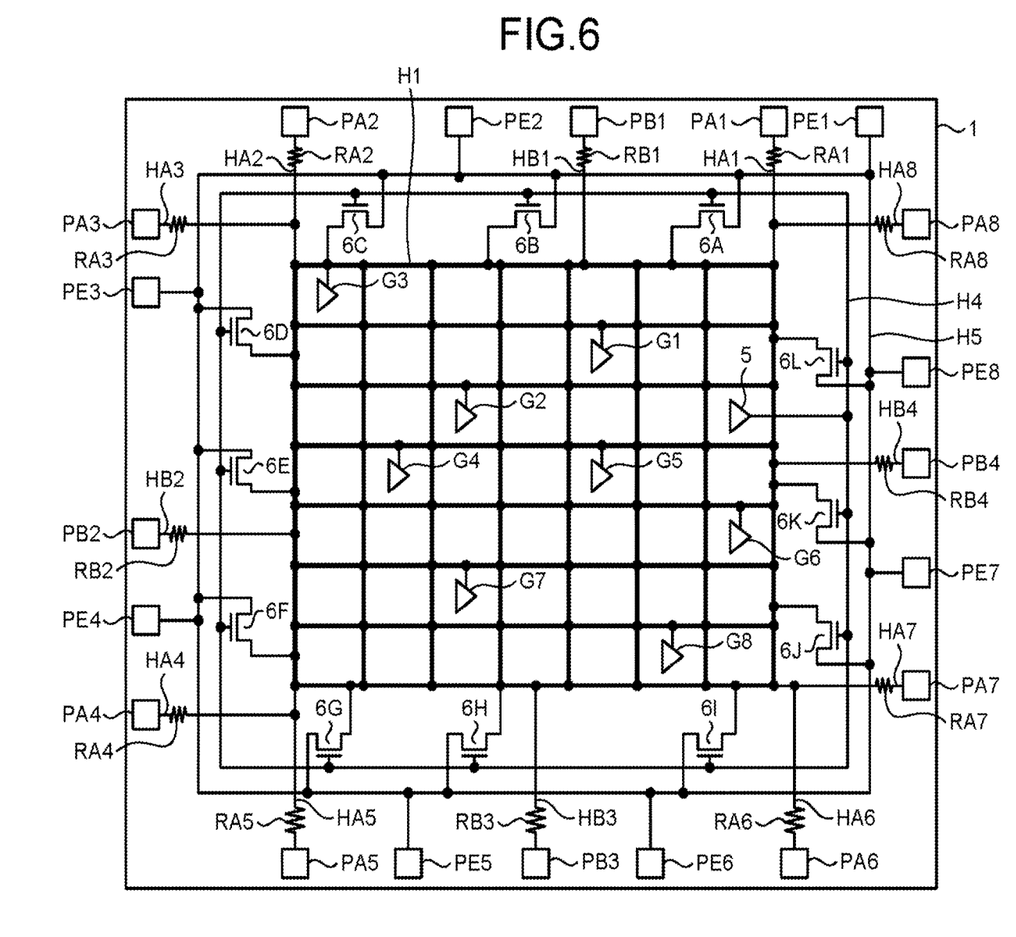
FIG. 6 is a planar view of a layout example of a semiconductor device according to a sixth embodiment.

FIG. 6 is a planar view of a layout example of a semiconductor device according to a sixth embodiment.

Referring to FIG. 6, the semiconductor chip 1 is provided with pad electrodes PA1 to PA8 in place of the pad electrodes PA1 to PA3 illustrated in FIG. 1, and is provided with pad electrodes PB1 to PB4 in place of the pad electrodes PB1 and PB2 illustrated in FIG. 1. In addition, the semiconductor chip 1 is provided with pad electrodes PE1 to PE8 in place of the pad electrode PE illustrated in FIG. 1. The pad electrodes PA1 to PA8 are preferably arranged at regular spacings around the semiconductor chip 1. The pad electrodes PB1 to PB4 are preferably arranged at regular spacings around the semiconductor chip 1. The pad electrodes PE1 to PE8 preferably arranged at regular spacings around the semiconductor chip 1. In addition, the power-supply wire H1 is arranged in a meshed pattern on the semiconductor chip 1. Further, internal circuits G1 to G8 and an amplifier 5 are formed on the semiconductor chip 1 so that power is supplied from the power-supply wire H1 to the internal circuits G1 to G8. As shown in the heavy lines in FIG. 6, the power-supply wire H1 here refers to a wire that constitutes current pathways from the regulator output VOUT to the internal circuits G1 to G8 when the semiconductor chip 1 is singly provided. The power-supply wire H1 is connected to the pad electrodes PA1 to PA8 via the resistors RA1 to RA8, respectively, and is connected to the pad electrodes PB1 to PB4 via the resistors RB1 to RB4, respectively. To connect the resistors RA1 to RA8 between the power-supply wire H1 and the pad electrodes PA1 to PA8, the wires HA1 to HA8 routed from the power-supply wire H1 toward the pad electrodes PA1 to PA8 can be used. To connect the resistors RB1 to RB4 between the power-supply wire H1 and the pad electrodes PB1 to PB4, the wires HB1 to HB4 routed from the power-supply wire H1 toward the pad electrodes PB1 to PB4 can be used. In addition, the resistances of the resistors RA1 to RA8 and RB1 to RB4 are set such that the resistances between the pad electrodes PB1 to PB4 and the power-supply wire H1 are smaller than the resistances between the pad electrodes PA1 to PA8 and the power-supply wire H1. For example, the resistance between the pad electrode PA1 and the power-supply wire H1 takes on the value obtained by adding up the resistance of the wire HA1 and the resistance of the resistor RA1. Similarly, the resistance between the pad electrode PB1 and the power-supply wire H1 takes on the value obtained by adding up the resistance of the wire HB1 and the resistance of the resistor RB1. When the wiring resistances of the wires HA1 to HA8 and HB1 to HB4 are negligible, the resistances of the resistors RB1 to RB4 are set to be smaller than the resistances of the resistors RA1 to RA8. The power-supply wire H1 is connected to the pad electrodes PA1 to PA8 via the wires HA1 to HA8, respectively, and is connected to the pad electrodes PB1 to PB4 via the wires HB1 to HB4, respectively. The resistors RA1 to RA8 may be parasitic resistors of wires made from the same material as that for the wires HA1 to HA8. In addition, the resistors RB1 to RB4 may be parasitic resistors of wires made from the same material as that for the wires HB1 to HB4. At that time, the wire resistances of the wires HB1 to HB4 may be made smaller than the wire resistances of the wires HA1 to HA8. The wires HA1 to HA8 and HB1 to HB4 routed from the power-supply wire H1 toward the pad electrodes PA1 to PA8 and PB1 to PB4 do not constitute the current pathways from the regulator output VOUT to the internal circuits G1 to G8 when the semiconductor chip 1 is singly provided, and thus the wires HA1 to HA8 and HB1 to HB4 are not included in the power-supply wire H1.

The semiconductor chip 1 is also provided with transistors 6A to 6L in place of the transistor 6 illustrated in FIG. 1, which are distributed around the power-supply wire H1. Wires H4 and H5 are arranged in a double loop around the transistors 6A to 6L. The wire H4 is connected to the gates of the transistors 6A to 6L and the output of the amplifier 5. The wire H5 is connected to the sources of the transistors 6A to 6L and the pad electrodes PE1 to PE8. The regulator output VOUT is output from the drains of the transistors 6A to 6L. The pad electrodes PA1 to PA8 are connected together via the wire H2 illustrated in FIG. 1, and the pad electrodes PB1 to PB4 are connected together via the wire H3 illustrated in FIG. 1.

In this example, by arranging the pad electrodes PA1 to PA8 at regular spacings around the semiconductor chip 1 and connecting together the pad electrodes PA1 to PA8 via the wire H2, the capacitor C2 can be recognized from the transistors 6A to 6L not through the power-supply wire H1, which reduces the influence of the parasitic resistor RP in the power-supply wire H1.

In addition, in the configuration of FIG. 6, the transistors 6A to 6L are distributed around the power-supply wire H1, and the wires H4 and H5 are arranged around the transistors 6A to 6L. Accordingly, it is possible to suppress fluctuations in power-supply voltages of the internal circuits G1 to G8 caused by the parasitic resistor RP of the power-supply wire H1. In addition, it is possible to prevent occurrence of capacitance coupling between the power-supply wire H1 and the wires H4 and H5, thereby to improve uniformity of power-supply voltages to be supplied to the internal circuits G1 to G8.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   an integrated circuit formed on a semiconductor chip;
   a first pad electrode formed on the semiconductor chip;
   a second pad electrode formed on the semiconductor chip;
   a third pad electrode formed on the semiconductor chip;
   a power-supply wire formed on the semiconductor chip;
   a regulator that supplies a power-supply voltage to the integrated circuit via the power-supply wire;
   a first resistor that is connected between the first pad electrode and the power-supply wire and sets a resistance between the first pad electrode and the power-supply wire to a first resistance;
   a second resistor that is connected between the second pad electrode and the power-supply wire and sets a resistance between the second pad electrode and the power-supply wire to a second resistance smaller than the first resistance; and
   a third resistor that is connected between the third pad electrode and the power-supply wire and sets a resistance between the third pad electrode and the power-supply wire to a third resistance larger than the second resistance,
   wherein the integrated circuit and the regulator are formed on the same semiconductor chip,
   the first pad electrode and the third pad electrode are connected together via a first wire, the first wire being located outside of the semiconductor chip, and
   the first pad electrode and the third pad electrode are respectively usable to take out an output of the regulator to the first wire.

2. The semiconductor device according to claim 1, further comprising:
   a package that seals the semiconductor chip; and
   a second wire that is connected to the second pad electrode and is formed on the package, wherein
   the first pad electrode is not electrically connected to the second pad electrode, and
   the first wire is formed on the package.

3. The semiconductor device according to claim 1, further comprising:
   a fourth pad electrode formed on the semiconductor chip; and
   a fourth resistor that is connected between the fourth pad electrode and the power-supply wire and sets a resistance between the fourth pad electrode and the power-supply wire to a fourth resistance smaller than the first resistance and smaller than the third resistance,
   wherein
   the first resistor, the second resistor, the third resistor, and the fourth resistor are connected to the power-supply wire, and
   the second pad electrode and the fourth pad electrode are connected together via a second wire, the second wire being located outside of the semiconductor chip.

4. The semiconductor device according to claim 2, wherein the package includes:
   a first terminal connected to the first wire; and
   a second terminal connected to the second wire.

5. The semiconductor device according to claim 4, further comprising:
   a wiring substrate on which the package is implemented; and
   a capacitor that is implemented on the wiring substrate and is connected to the first terminal.

6. The semiconductor device according to claim 2, wherein the package includes a capacitor connected to the first pad electrode.

7. The semiconductor device according to claim 1, further comprising:
   a wiring substrate on which the semiconductor chip is implemented;
   a second wire that is connected to the second pad electrode and is formed on the wiring substrate; and
   a capacitor connected to the first wire, wherein
   the first wire is formed on the wiring substrate.

8. The semiconductor device according to claim 1, wherein at least the first resistor is a parasitic resistor of a wire connecting the first pad electrode and the power-supply wire, and
   the second resistor is a parasitic resistor of a wire connecting the second pad electrode and the power-supply wire.

9. The semiconductor device according to claim 1, wherein the regulator includes:
   a transistor connected between a regulator power supply and the power-supply wire; and
   an amplifier that controls conduction of the transistor according to output from the regulator, and wherein the power-supply wire is arranged in a meshed pattern on the semiconductor chip, and
the transistor is distributed around the power-supply wire.

10. A semiconductor device, comprising:
an integrated circuit formed on a semiconductor chip;
a first pad electrode formed on the semiconductor chip;
a second pad electrode formed on the semiconductor chip;
a third pad electrode formed on the semiconductor chip;
a power-supply wire formed on the semiconductor chip;
a regulator that supplies a power-supply voltage to the integrated circuit via the power-supply wire;
a first wire that is connected between the first pad electrode and the power-supply wire and has a first resistance;
a second wire that is connected between the second pad electrode and the power-supply wire and has a second resistance smaller than the first resistance; and
a third wire that is connected between the third pad electrode and the power-supply wire and has a third resistance larger than the second resistance,
wherein the integrated circuit and the regulator are formed on the same semiconductor chip,
the first pad electrode and the third pad electrode are connected together via a fourth wire, the third wire being located outside of the semiconductor chip, and
the first pad electrode and the third pad electrode are respectively usable to take out an output of the regulator to the fourth wire.

11. The semiconductor device according to claim 10, further comprising:
a package that seals the semiconductor chip; and
a fifth wire that is connected to the second pad electrode and is formed on the package, wherein
the first pad electrode is not electrically connected to the second pad electrode, and
the fourth wire is formed on the package.

12. The semiconductor device according to claim 10, further comprising:
a fourth pad electrode formed on the semiconductor chip; and
a fifth wire that is connected between the fourth pad electrode and the power-supply wire and sets a resistance between the fourth pad electrode and the power-supply wire to a fourth resistance smaller than the first resistance and smaller than the third resistance,
wherein
the first wire, the second wire, the third wire, and the fifth wire are connected to the power-supply wire, and
the second pad electrode and the fourth pad electrode are connected together via a sixth wire, the sixth wire being located outside of the semiconductor chip.

13. The semiconductor device according to claim 11, wherein the package includes:
a first terminal connected to the fourth wire; and
a second terminal connected to the fifth wire.

14. The semiconductor device according to claim 13, further comprising:
a wiring substrate on which the package is implemented; and
a capacitor that is implemented on the wiring substrate and is connected to the first terminal.

15. The semiconductor device according to claim 11, wherein the package includes a capacitor connected to the first pad electrode.

16. The semiconductor device according to claim 10, further comprising:
a wiring substrate on which the semiconductor chip is implemented;
a fifth wire that is connected to the second pad electrode and is formed on the wiring substrate; and
a capacitor connected to the fourth wire in the wiring substrate, wherein
the fourth wire is formed on the wiring substrate.

17. The semiconductor device according to claim 10, wherein at least the first resistance is a resistance of a parasitic resistor of the first wire, and
the second resistance is a resistance of a parasitic resistor of the second wire.

18. The semiconductor device according to claim 10, wherein the regulator includes:
a transistor connected between a regulator power supply and the power-supply wire; and
an amplifier that controls conduction of the transistor according to output from the regulator, and wherein
the power-supply wire is arranged in a meshed pattern on the semiconductor chip, and
the transistor is distributed around the power-supply wire.

* * * * *